United States Patent
Chen et al.

(10) Patent No.: US 8,900,886 B2
(45) Date of Patent: Dec. 2, 2014

(54) SYSTEM AND METHOD OF MONITORING AND CONTROLLING ATOMIC LAYER DEPOSITION OF TUNGSTEN

(75) Inventors: Kun-Ei Chen, Beimen Township, Tainan County (TW); Jen-Yi Chen, Linnei Township, Yunlin County (TW); Yi-Chung Lin, Tainan (TW); Chen-Chieh Chiang, Kaohsiung (TW); Ling-Sung Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 20 days.

(21) Appl. No.: 13/486,270

(22) Filed: Jun. 1, 2012

(65) Prior Publication Data
US 2013/0323859 A1    Dec. 5, 2013

(51) Int. Cl.
    *H01L 21/66*    (2006.01)
(52) U.S. Cl.
    USPC ..................... 438/7; 257/E21.528

(58) Field of Classification Search
    None
    See application file for complete search history.

(56) References Cited

U.S. PATENT DOCUMENTS

| | | | |
|---|---|---|---|
| 2005/0046825 A1* | 3/2005 | Powell et al. | 356/72 |
| 2007/0239375 A1* | 10/2007 | Kaushal et al. | 702/81 |

* cited by examiner

*Primary Examiner* — Seahvosh Nikmanesh
(74) *Attorney, Agent, or Firm* — Duane Morris LLP

(57) ABSTRACT

A method of semiconductor processing comprises providing a semiconductor wafer in a processing chamber; feeding at least one tungsten-containing precursor in a gas state into the processing chamber for atomic layer deposition (ALD) of tungsten; feeding at least one reducing chemical in a gas state into the processing chamber; and monitoring a concentration of at least one gaseous byproduct in the chamber; and providing a signal indicating concentration of the at least one gaseous byproduct in the chamber. The byproduct is produced by a reaction between the at least one tungsten-containing precursor and the at least one reducing chemical during the ALD.

18 Claims, 5 Drawing Sheets

SYSTEM AND METHOD OF MONITORING AND CONTROLLING ATOMIC LAYER DEPOSITION OF TUNGSTEN

FIELD

The disclosed system and method relate to semiconductor processing.

BACKGROUND

Atomic layer deposition (ALD) of films is extensively used in the semiconductor industry for fabricating integrated circuits on semiconductor wafers. This technique is based on a binary chemical vapor deposition (CVD) reaction between two reactants introduced into a semiconductor processing chamber sequentially. The self-limiting surface reaction yields molecular or atomic layers of films in a controlled and conformal manner.

Tungsten plugs function as metal contacts in a semiconductor device or as electric conductors between upper and lower interconnect levels in a semiconductor integrated circuit. For example, tungsten plugs are used as metal contacts above the source/drain regions or above the gate stack in a complementary metal oxide semiconductor (CMOS) device.

In an ALD process for forming tungsten plugs, the binary reactants generally include a tungsten precursor in gas state such as tungsten hexafluoride ($WF_6$) and a reducing gaseous reactant. The reducing gas is a hydrogen containing chemical such as $B_2H_6$ and $Si_2H_6$.

Poor quality such as absence of the plugs or non-uniformity of the deposited film in the desired areas can damage device structures and reduce the chip yield in the semiconductor fabrication. So deposition of a thin film in ALD of tungsten should be precisely controlled.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

DETAILED DESCRIPTION

Figure 1:
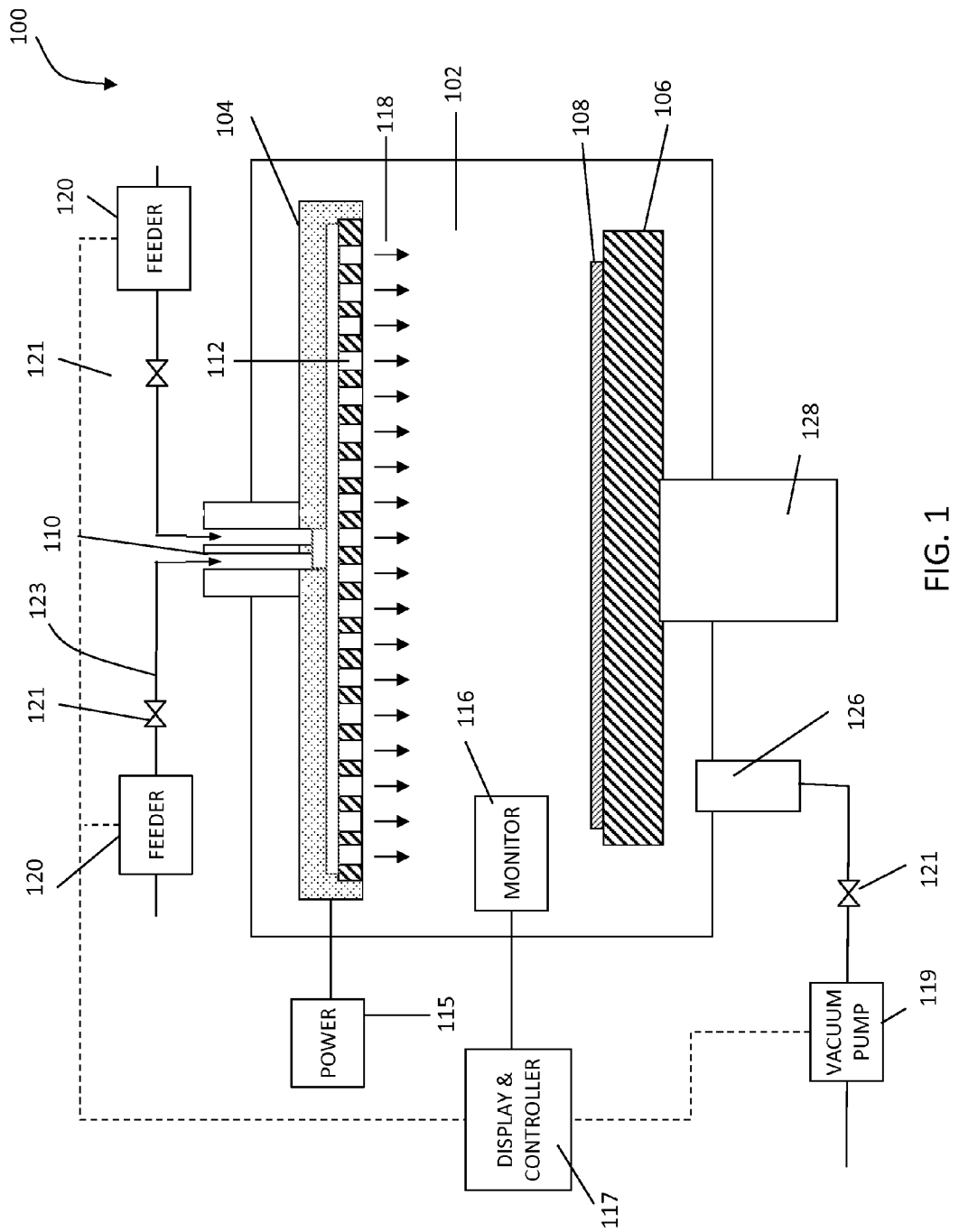
FIG. 1 is a schematic cross-section view illustrating an exemplary semiconductor equipment system having a monitor configured to measure a concentration of at least one gaseous byproduct in a processing chamber from an ALD reaction for tungsten, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This disclosure relates to a monitoring method and device for use in semiconductor processing chamber in the process of atomic layer deposition (ALD) of tungsten.

The inventors have determined that poor tungsten plug formation is a significant factor for wafer yield in semiconductor fabrication and performance of fabricated semiconductor devices. Poor deposition of tungsten can result in poor quality or even absence of tungsten plugs in integrated circuits of the fabricated device.

In an ALD process for forming tungsten plugs, the binary reactants generally include a tungsten precursor in gas state such as tungsten hexafluoride ($WF_6$) and a reducing gaseous reactant. The reducing gas is a hydrogen containing chemical such as $B_2H_6$ and $Si_2H_6$.

The inventors have determined that a well-controlled pressure of the tungsten precursor such as $WF_6$ is important to the quality of tungsten plug deposition. However, it is relatively difficult to precisely measure the level of the tungsten precursor such as $WF_6$ in a processing chamber during the ALD process.

This disclosure provides a semiconductor equipment system comprising a monitor adapted to measure at least one gaseous byproduct in atomic layer deposition (ALD) of tungsten, and a related method of semiconductor processing. The system generates a signal indicating concentration of the at least one gaseous byproduct. This signal is used as an indicator for adjusting pressure of a tungsten precursor in the chamber so as to control the deposition of tungsten.

In some embodiments, a method of semiconductor processing comprises feeding at least one tungsten-containing precursor in a gas state into the processing chamber for ALD of tungsten; feeding at least one reducing gas into the processing chamber; monitoring a concentration of at least one gaseous byproduct in the chamber; and providing a signal indicating concentration of the at least one gaseous byproduct in the chamber. In some embodiments, the monitoring of the at least one gaseous byproduct comprises using optical emission spectroscopy. In some embodiments, such a method further comprises comparing the signal indicating concentration of the at least one gaseous byproduct with a predetermined profile of the signal corresponding to a threshold value of the concentration; and adjusting processing conditions until the signal indicates that concentration of the at least one gaseous byproduct is not higher than the threshold value.

This disclosure also provides a semiconductor equipment system, which comprises a processing chamber and a monitor. The processing chamber is configured to hold a semiconductor wafer inside the processing chamber and to receive at least one tungsten-containing precursor and at least one reducing chemical in a gas state into the processing chamber for ALD of tungsten. The monitor is configured to measure and provide a signal indicating concentration of the at least one gaseous byproduct of such ALD reaction in the chamber. In some embodiments, the system further comprises a controller. The controller is configured to compare the signal indicating concentration of the at least one gaseous byproduct with a predetermined profile indicating a threshold value of the concentration. The controller is also configured to adjust at least one processing condition so that the concentration of the at least one gaseous byproduct is reduced to be the same or less than the threshold value.

For brevity, references to "byproduct" made below will be understood to encompass any chemical species excluding tungsten plugs which are produced by a reaction between the at least one tungsten-containing precursor and the at least one reducing chemical during the atomic layer composition (ALD).

FIG. 1 is a schematic cross-section view illustrating an exemplary semiconductor equipment system 100 having a monitor 116 configured to measure a concentration of at least one gaseous byproduct in a processing chamber 102 from an ALD reaction for tungsten, in accordance with some embodiments.

In FIG. 1, the exemplary semiconductor equipment system 100 comprises processing chamber 102, a gas distribution apparatus 104 and a stage 106 for a semiconductor substrate or wafer 108. Gas distribution apparatus 104 and stage 106 are configured to be mounted inside chamber 102. Semiconductor wafer 108 is disposed on stage 106.

The gas distribution apparatus 104 is a shower head in some embodiments. It is configured to provide a processing gas onto semiconductor wafer 108 inside chamber 102.

At least two inlets 110 are fluidly connected with the gas distribution apparatus 104, and are adapted to supply the processing gases for atomic layer deposition of tungsten through at least two feeders 120. In some embodiments, a valve 121 or other suitable control device is fluidly coupled with and are located in between, a feeder 120 and an inlet 110 through supplying tube or conduits 123.

In some embodiments, feeders 120 and valves 121 are connected to a processor (not shown), which automatically adjusts the level of processing gas from respective feeder 120. The processor can be, for example, a central processing unit (CPU), a microprocessor, a programmable logic control unit, a computer or other device or system that is adapted to control a respective feeding level in a respective feeder.

At least one of the feeders 120 is configured to provide at least one tungsten-containing precursor for ALD of tungsten. Examples of suitable precursors include but are not limited to tungsten hexafluoride ($WF_6$), tungsten hexachloride ($WCl_6$), tungsten carbonyl ($W(CO)_6$), bis(clopentadienyl) tungsten chloride, or any other combination or derivatives thereof. In some embodiments, such a precursor comprises tungsten hexafluoride ($WF_6$).

At least one of feeders 120 is configured to provide at least one reducing chemical comprising at least one hydrogen-containing chemical. In some embodiments, the at least one hydrogen-containing chemical is selected from the group consisting of silane, disilane, diborane, phosphine, and any derivatives or combination thereof. In some embodiments, system 100 is configured to provide another gas such as hydrogen ($H_2$) together with the at least one hydrogen-containing chemical. The at least one of feeders 120 is configured to feed the at least one hydrogen-containing chemical into chamber 102 sequentially after the tungsten precursor is fed. The tungsten precursor and the at least one hydrogen-containing chemical are alternatively fed in an ALD process in accordance with some embodiments. In some embodiments, the feeding rate is in the range of 1-300 sccm.

The processing gases of the tungsten precursor and the hydrogen-containing chemical are in the form of a pure chemical gas, an ionized gas comprising plasma, a mixture of these chemicals with other carrier gases, or any other type of states suitable for a process of atomic layer deposition (ALD).

In some embodiments, processing gases are directly fed into the chamber 102 without significant changes in chemical composition and physical state. In some embodiments, processing gases including the tungsten precursor and the reducing chemical are transformed to plasma comprising ionized chemical species in the gas distribution apparatus 104. If a plasma method is used, gas distribution apparatus 104 also serves as an electrode which is connected with a radio frequency (RF) power 115, for example. The reactant gas is ionized to form plasma containing processing gas.

Power 115 provides energy for the ionization process. Power 115 can be, for example, a radio frequency (RF) power supply or other power supply that is adapted to provide a high voltage sufficient to ionize the tungsten precursor and the reducing chemical in a gas state fed through inlet 110, and to generate plasma in chamber 102.

In some embodiments, a vacuum port 126 is provided on chamber 102. Connected with a vacuum pump 119 with valve or controls 121, vacuum port 126 is used to apply vacuum for the whole chamber 102.

Stage 106 is disposed within chamber 102 with a stage support 128. In some embodiments, stage 106 is disposed on the chamber 102 so that a portion of stage 106 is outside chamber 102. Stage support 128 may not be needed in such embodiments. Stage 106 may comprise an electro-static chuck, vacuum system, clamp or other apparatus that is able to keep semiconductor substrate 108 substantially on the stage. In some embodiments, stage 106 further comprises a bottom electrode coupled to a power supply 115 to enhance plasma within chamber 102.

During the ALD process, the tungsten precursor and the at least one hydrogen-containing chemical react with each other to generate tungsten on semiconductor substrate 108. The reaction also generates at least one gaseous byproduct. For example, $WF_6$ reacts with $B_2H_6$ to give tungsten (W) and byproducts including $BF_3$ and $H_2$. The byproducts from the reaction between $WF_6$ and $Si_2H_6$ may include $SiF_4$, $SiHF_3$ and $H_2$.

As shown in FIG. 1, the exemplary semiconductor processing system 100 comprises a monitor 116. Monitor 116 is configured to measure a concentration of at least one byproduct in a gas state, which is produced from the reaction of the at least one tungsten-containing precursor and the least one hydrogen-containing chemical during the ALD process. In some embodiments, monitor 116 directly detects and measures the chemical species in the gaseous byproducts. In some embodiments, monitor 116 detects and measures the radiation from ionized species in the plasma environment. In some embodiments, monitor 116 comprises a fiber optic sensor. In some embodiments, monitor 116 selectively measures one byproduct only.

Examples of monitors 116 include but are not limited to the detectors based on mass spectroscopy, optical emission spectroscopy, and a pulsed plasma monitoring method. In some embodiments, monitor 116 is based on pulsed plasma monitoring. An example of such instrument is HORIBA Jobin Yvon spectroscopy system available from HORIBA Scientific of NJ, USA. In some embodiments, monitor 116 is an optical emission spectrometer, which monitors the intensity (a.u.) of light at different wavelengths emitted by the excited atoms or molecules in a plasma state. The specific peak at a certain wavelength is used for qualitative chemical analysis. The light intensity (a.u.) is used as signal indicating or accurately measuring the concentration of a species. Examples of such a spectrometer include but are limited to the PDA Series such as PDA-8000 and PDA-7000 available from Shimadzu of Japan.

Figure 2:
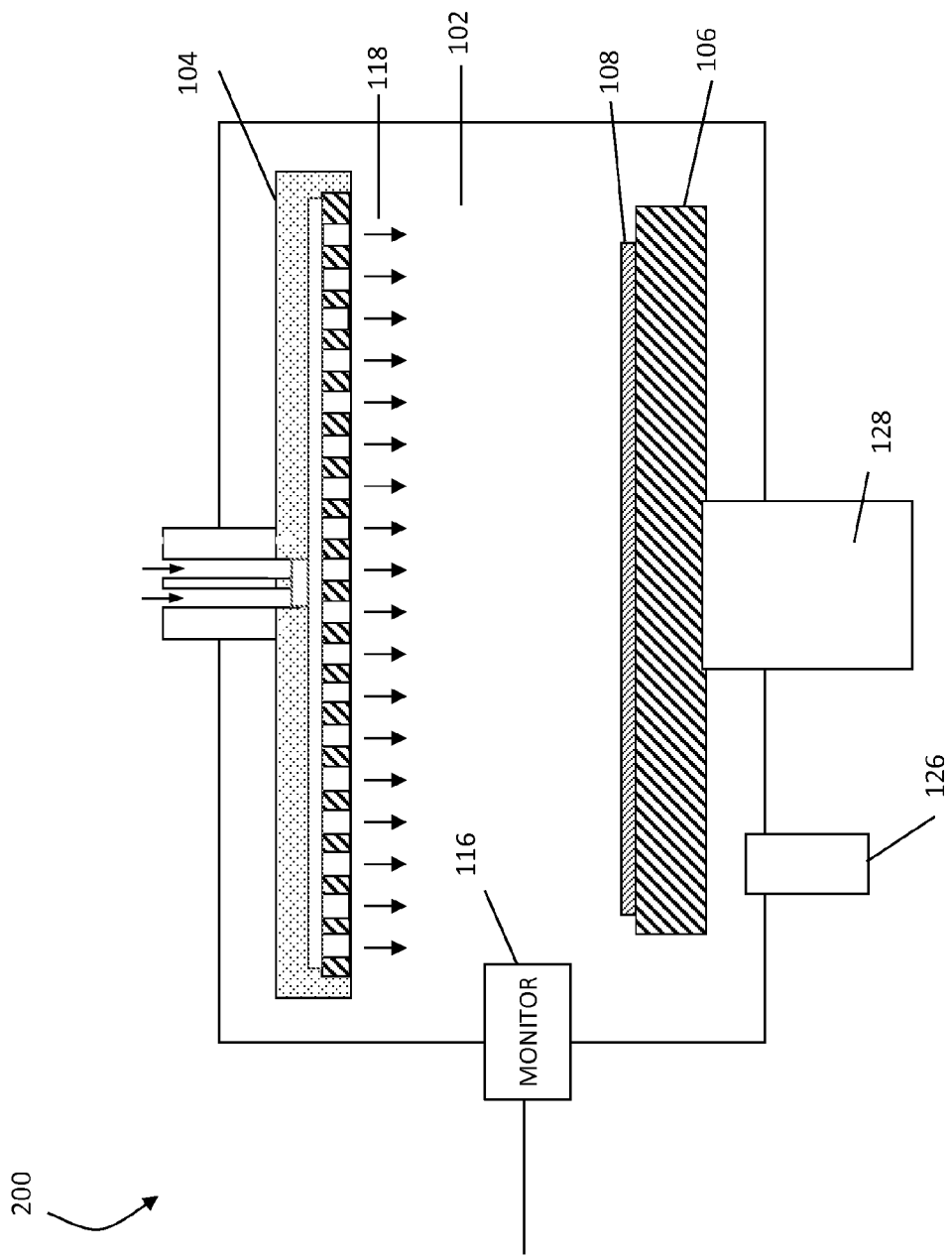
FIG. 2 is a schematic cross-section view illustrating an exemplary semiconductor equipment system having the monitor on the wall of the processing chamber, in accordance with some embodiments.
Figure 3:
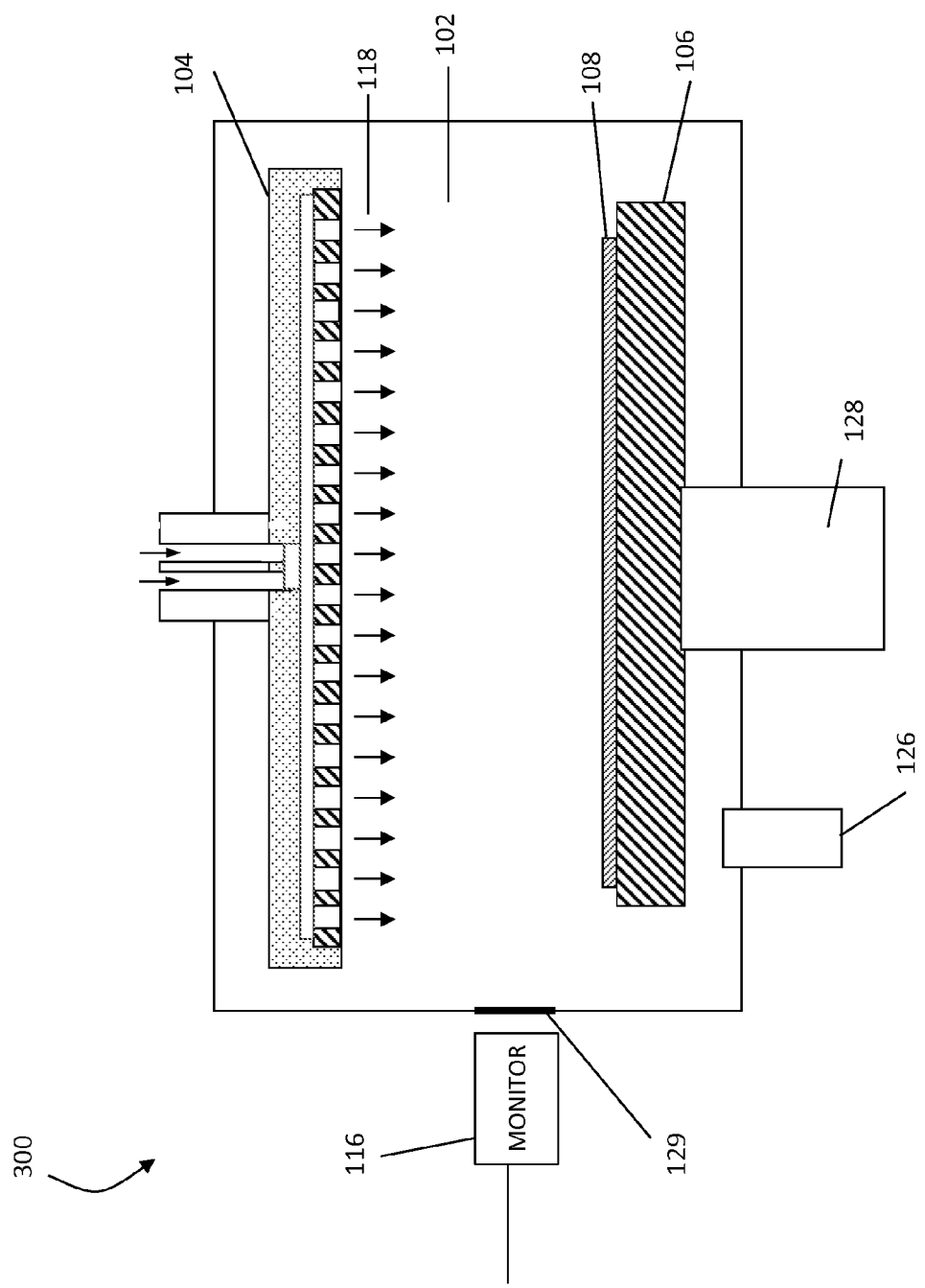
FIG. 3 is a schematic cross-section view illustrating an exemplary semiconductor equipment system having the monitor outside the processing chamber, in accordance with some embodiments.

The location of monitor 116 is not limited to that shown in FIG. 1. In some embodiments, monitor 116 is located inside or partially inside processing chamber 102. In some embodiments, monitor 116 is outside processing chamber 102. An exemplary monitor 116 is located inside processing chamber 102 as illustrated in FIG. 1. In some other embodiments, monitor 116 is on the wall of chamber 102 or outside chamber 102, as shown in FIGS. 2 and 3. In FIGS. 2 and 3, like items are indicated by like reference numerals, and for brevity, descriptions of the structure, provided above with reference to FIGS. 2 and 3, are not repeated.

FIG. 2 is a schematic cross-section view illustrating an exemplary semiconductor equipment system 200 having monitor 116 on the wall of processing chamber 102, in accordance with some embodiments.

FIG. 3 is a schematic cross-section view illustrating an exemplary semiconductor equipment system 300 having monitor 116 outside processing chamber 102, in accordance with some embodiments.

In FIG. 3, there is window 129 on the wall of chamber 102, and is configured to transmit light or other irradiation from the byproducts inside chamber 102. Window 129 in the processing chamber 102 allows the byproducts from the reaction of ALD of tungsten to be monitored. In some embodiments, monitor 116 is located outside the window 129, and window 129 is configured to transmit radiation emitted by different chemical species in chamber 102 during the ALD process. Monitor 116 comprises a fiber optical sensor in some embodiments. The transmitted radiation is received by monitor 116 for giving a signal indicating a concentration of at least one byproduct. In some embodiments, monitor 116 comprises a filter or monochromator for filtering out all the wavelengths of radiation except for the one for one specific byproduct selected to be monitored. In some embodiments, the monitor 116 selectively monitors and measures one chosen byproduct from the process of ALD of tungsten.

Referring back to FIG. 1, the semiconductor processing system comprises a controller 117 in some embodiments. In some embodiments, controller 117 also comprises a display device, which is configured to display the measured results. As described in FIGS. 4 and 5, controller 117 is configured to compare the signal indicating concentration of the at least one gaseous byproduct with a predetermined profile of the signal corresponding to a threshold value of the concentration. Controller 117 is further configured to adjust processing conditions until the signal indicates that concentration of the at least one gaseous byproduct is not higher than the threshold value. In some embodiments, controller 117 is connected with monitor 116, vacuum pump 119, and the at least two feeders 120. In some embodiments, controller 117 is optionally connected with power 115 for gas distribution apparatus 104.

In some embodiments, the semiconductor equipment system, comprising a displaying device outside the processing chamber, which is configured to display the signal indicating concentration of the at least one gaseous byproduct and the predetermined profile indicating a threshold value of the concentration. In some embodiments, a warning signal is generated, indicating "abnormal" deposition, when the first signal indicates that the concentration of the at least one gaseous byproduct is higher than the threshold concentration value.

Figure 4:
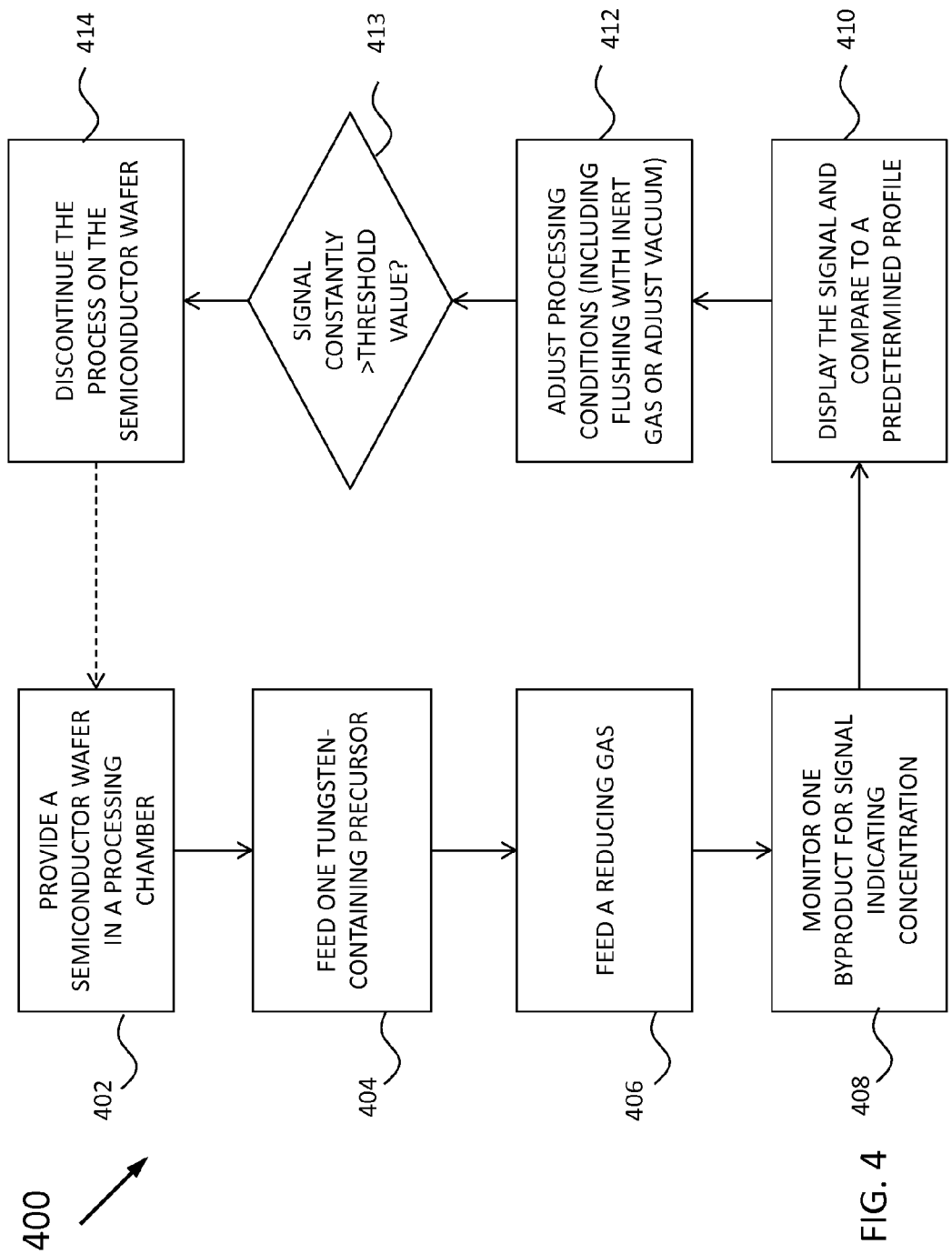
FIG. 4 is a flow chart diagram illustrating an exemplary method comprising monitoring a concentration of at least one gaseous byproduct from a tungsten ALD reaction in the chamber, in accordance with some embodiments.

FIG. 4 is a flow chart diagram illustrating an exemplary method 400 for monitoring a concentration of at least one gaseous byproduct from a tungsten ALD reaction in chamber 102, in accordance with some embodiments.

In step 402, a semiconductor substrate or wafer 108 is provided in a processing chamber 102 in an exemplary semiconductor processing equipment system, as described in FIG. 1.

In step 404, a tungsten precursor in gas state is fed into processing chamber 102 through a respective feeder 120 and inlet 110, as described in FIG. 1. The tungsten precursor can directly pass through a gas distribution apparatus 104 without any chemical or physical changes. In some other embodiments, the tungsten precursor is ionized into plasma after passing through gas distribution apparatus 104.

In step 406, at least one hydrogen-containing chemical is fed into chamber 102 sequentially after the tungsten precursor is fed. The tungsten precursor and the at least one hydrogen-containing chemical are alternatively feed in pulses in some embodiments. In some embodiments, the at least one hydrogen-containing chemical is ionized to become plasma after passing through gas distribution apparatus 104 as described in FIG. 1. The tungsten precursor and the at least one hydrogen-containing chemical react with each other to generate tungsten on semiconductor substrate 108, and at least one gaseous byproduct. For example, $WF_6$ reacts with $B_2H_6$ to give tungsten (W) and byproducts including $BF_3$ and $H_2$. The byproducts from the reaction between $WF_6$ and $Si_2H_6$ may include $SiF_4$, $SiHF_3$ and $H_2$.

In step 408, a concentration of at least one gaseous byproduct is measured and monitored during the ALD process, and a signal identifying such concentration is provided using the exemplary monitored described in FIG. 1. Monitor 116 may directly detect the chemical species in the gaseous byproducts, or the radiation from ionized species in the plasma environment. In some embodiments, monitor 116 selectively measures one byproduct only.

As described in FIG. 1, one exemplary monitor 116 is an optical emission spectrometer, which monitors the intensity (a.u.) of light at different wavelengths emitted by the excited atoms or molecules in a plasma state. The specific peak at a certain wavelength is used for qualitative chemical analysis. The light intensity (a.u.) is used as signal indicating or accurately measuring the concentration of a gaseous species.

In step 410, the signal indicating a concentration of a gaseous byproduct is compared to a predetermined profile of such signal corresponding to a threshold value of the concentration, below which deposition of good tungsten plugs can be achieved. In some embodiments, the corresponding results are displayed graphically in monitor 116 or controller 117.

Figure 5:
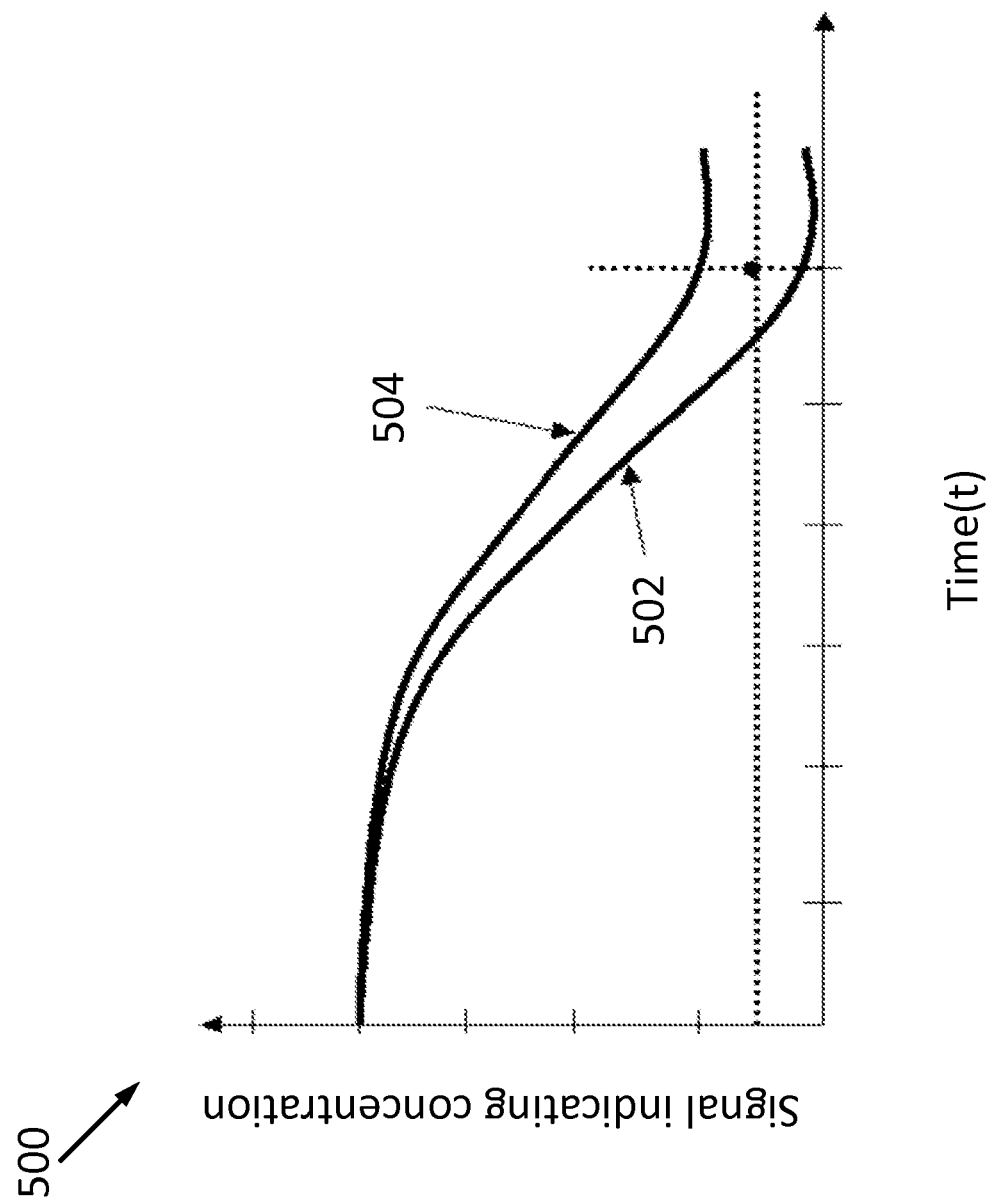
FIG. 5 is a schematic diagram illustrating the signal indicating concentration of the at least one gaseous byproduct with comparison to the predetermined profile of the signal corresponding to a threshold value of the concentration, in accordance with some embodiments.

FIG. 5 is a schematic diagram 500 illustrating the signal indicating a concentration of the at least one gaseous byproduct with comparison to the predetermined profile 502 of the signal corresponding to a threshold value of the concentration, in accordance with some embodiments. The x-axis represents the processing time. The y-axis represents the signal indicating a concentration of the at least one gaseous byproduct. The predetermined profile 502 is measured and stored in the monitor 116 or controller 117. If the signal indicating a concentration of the monitored byproduct indicates that the concentration is higher than the threshold value during a certain time interval, an alarm is generated. For example, in curve 504 of FIG. 5, the processing parameters are "abnormal" for deposition of tungsten in the ALD process. Step 412 of adjusting processing conditions is triggered.

In step 412, processing conditions are adjusted so that the signal indicating a concentration of the at least one gaseous byproduct being monitored is equal to or lower than the threshold value on the predetermined profile at the corresponding time interval. Examples of adjusting such processing conditions include but are not limited to applying vacuum to the processing chamber, changing the rate of feeding the at least one tungsten-containing precursor into the processing chamber, changing the rate of feeding the at least one reducing chemical into the processing chamber into the processing chamber, and any combination thereof. In some embodiments, step 412 includes adjusting plasma conditions by adjusting parameters for power 115 connected with gas distributor apparatus 104.

In some embodiments, the method of semiconductor processing comprises discontinuing processing of the wafer if the signal indicating the concentration of the at least one gaseous byproduct constantly exceeds the threshold value for a predetermined time interval.

In step 413 of FIG. 4, if the signal indicating the concentration of the at least one gaseous byproduct constantly exceeds the threshold value, the process will be discontinued based on step 414. A new process is started using a new semiconductor wafer.

This disclosure provides a semiconductor equipment system comprising a monitor adapted to measure at least one gaseous byproduct in atomic layer deposition (ALD) of tungsten, and a related method of semiconductor processing.

In some embodiments, a method of semiconductor processing comprises providing a semiconductor wafer in a processing chamber; feeding at least one tungsten-containing precursor in a gas state into the processing chamber for atomic layer deposition (ALD) of tungsten; feeding at least one reducing chemical in a gas state into the processing chamber; monitoring a concentration of at least one gaseous byproduct in the chamber; and providing a signal indicating concentration of the at least one gaseous byproduct in the chamber. The byproduct is produced by a reaction between the at least one tungsten-containing precursor and the at least one reducing chemical during the ALD. In some embodiments, the monitoring of the at least one gaseous byproduct comprises using optical emission spectroscopy.

In some embodiments, a method of semiconductor processing further comprises comparing the signal indicating concentration of the at least one gaseous byproduct with a predetermined profile of the signal corresponding to a threshold value of the concentration; and adjusting processing conditions until the signal indicates that concentration of the at least one gaseous byproduct is not higher than the threshold value. In some embodiments, the adjusting processing conditions comprises applying vacuum to the processing chamber, changing the rate of feeding the at least one tungsten-containing precursor into the processing chamber, changing the rate of feeding the at least one reducing chemical into the processing chamber into the processing chamber, or any combination thereof. In some embodiments, the method of semiconductor processing comprises discontinuing processing of the wafer if the signal indicates that concentration of the at least one gaseous byproduct consistently exceeds the threshold value for a predetermined time interval.

In some embodiments, a semiconductor equipment system comprises a processing chamber and a monitor. The processing chamber is configured to hold a semiconductor wafer inside the processing chamber and to receive at least one tungsten-containing precursor and at least one reducing chemical in a gas state into the processing chamber for atomic layer deposition (ALD) of tungsten. The monitor is configured to measure at least one gaseous byproduct of a reaction between the at least one tungsten-containing precursor and the at least one reducing chemical. The monitor is also configured to provide a signal indicating concentration of the at least one gaseous byproduct in the chamber. In some embodiments, the monitor measures the at least one gaseous byproduct using optical emission spectroscopy. In some embodiments, the monitor is located inside or partially inside the processing chamber.

In some embodiments, the semiconductor equipment system further comprises a controller. The controller is configured to compare the signal indicating concentration of the at least one gaseous byproduct with a predetermined profile indicating a threshold value of the concentration. The controller is also configured to adjust at least one processing condition so that the concentration of the at least one gaseous byproduct is reduced to be the same or less than the threshold value.

In some embodiments, a semiconductor equipment system comprises a processing chamber, a monitor outside the processing chamber and a controller. The processing chamber is configured to hold a semiconductor wafer inside the processing chamber and to receive at least one tungsten-containing precursor and at least one reducing chemical in a gas state into the processing chamber for atomic layer deposition (ALD) of tungsten. The processing chamber comprises a window on one wall. The monitor is located the processing chamber, and is configured to measure at least one gaseous byproduct in the ALD reaction through the window on the wall of the processing chamber. The monitor is configured to provide a signal indicating concentration of the at least one gaseous byproduct in the chamber. The controller is configured to compare the signal indicating concentration of the at least one gaseous byproduct with a predetermined profile indicating a threshold value of the concentration; and adjust at least one processing condition so that the concentration of the at least one gaseous byproduct is reduced to be the same or less than the threshold value.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method of semiconductor processing, comprising
providing a semiconductor wafer in a processing chamber;
feeding at least one tungsten-containing precursor in a gas state into the processing chamber for atomic layer deposition (ALD) of tungsten;
feeding at least one reducing chemical in a gas state into the processing chamber;
monitoring a concentration of at least one gaseous byproduct in the chamber, the byproduct produced by a reaction between the at least one tungsten-containing precursor and the at least one reducing chemical during the ALD; and
providing a signal indicating concentration of the at least one gaseous byproduct in the chamber,
wherein the at least one reducing chemical is selected from the group consisting of silane, disilane, diborane and any combination thereof.

2. The method of claim 1, wherein the at least one tungsten-containing precursor comprises tungsten hexafluoride ($WF_6$).

3. The method of claim 1, wherein the monitoring of the at least one gaseous byproduct comprises using optical emission spectroscopy.

4. The method of claim 1, further comprising:
comparing the signal indicating concentration of the at least one gaseous byproduct with a predetermined profile of the signal corresponding to a threshold value of the concentration; and
adjusting processing conditions until the signal indicates that concentration of the at least one gaseous byproduct is not higher than the threshold value.

5. The method of claim 4, wherein the adjusting processing conditions comprises applying vacuum to the processing chamber.

6. The method of claim 4, wherein the adjusting processing conditions comprises changing the rate of feeding the at least one tungsten-containing precursor into the processing chamber.

7. The method of claim 4, wherein the adjusting processing conditions comprises changing the rate of feeding the at least one reducing chemical into the processing chamber into the processing chamber.

8. The method of claim 4, further comprising:
discontinuing processing of the wafer if the signal indicates that concentration of the at least one gaseous byproduct consistently exceeds the threshold value for a predetermined time interval.

9. The method of claim 1, further comprising:
comparing the signal indicating concentration of the at least one gaseous byproduct with a predetermined profile of the signal corresponding to a threshold value of the concentration; and
adjusting processing conditions until the signal indicates that concentration of the at least one gaseous byproduct is not higher than the threshold value.

10. The method of claim 9, wherein the at least one tungsten-containing precursor comprises tungsten hexafluoride ($WF_6$).

11. The method of claim 9, wherein the monitoring of the at least one gaseous byproduct comprises using optical emission spectroscopy.

12. The method of claim 9, wherein the adjusting processing conditions comprises changing the rate of feeding $WF_6$ into the processing chamber.

13. The method of claim 9, wherein the adjusting processing conditions comprises changing the rate of feeding $B_2H_6$ into the processing chamber into the processing chamber.

14. The method of claim 9, further comprising:
discontinuing processing of the wafer if the signal indicates that concentration of the at least one gaseous byproduct comprising $SiF_4$ or $SiHF_3$ consistently exceeds the threshold value for a predetermined time interval.

15. The method of claim 1, further comprising
comparing the signal indicating concentration of the at least one gaseous byproduct with a predetermined profile of the signal corresponding to a threshold value of the concentration;
adjusting processing conditions until the signal indicates that concentration of the at least one gaseous byproduct is not higher than the threshold value; and
discontinuing processing of the wafer if the signal indicates that concentration of the at least one gaseous byproduct consistently exceeds the threshold value for a predetermined time interval.

16. The method of claim 15, wherein
the at least one tungsten-containing precursor comprises tungsten hexafluoride ($WF_6$);
the at least one hydrogen-containing chemical in the at least one reducing chemical is selected from the group consisting of silane, disilane, diborane and any combination thereof; and
the monitoring of the at least one gaseous byproduct comprises using optical emission spectroscopy.

17. The method of claim 1, wherein the concentration of the at least one gaseous byproduct is directly detected and measured with a monitor inside the processing chamber in the step of monitoring.

18. The method of claim 1, wherein the concentration of the at least one gaseous byproduct is monitored using a fiber optical sensor to detect and measure radiation from ionized species in a plasma environment in the processing chamber.

* * * * *